(12) United States Patent
Metzen

(10) Patent No.: US 11,599,827 B2
(45) Date of Patent: Mar. 7, 2023

(54) METHOD AND APPARATUS FOR IMPROVING THE ROBUSTNESS OF A MACHINE LEARNING SYSTEM

(71) Applicant: Robert Bosch GmbH, Stuttgart (DE)

(72) Inventor: Jan Hendrik Metzen, Boeblingen (DE)

(73) Assignee: Robert Bosch GmbH, Stuttgart (DE)

( * ) Notice: Subject to any disclaimer, the term of this patent is extended or adjusted under 35 U.S.C. 154(b) by 456 days.

(21) Appl. No.: 16/753,595

(22) PCT Filed: Oct. 15, 2018

(86) PCT No.: PCT/EP2018/078005
§ 371 (c)(1),
(2) Date: Apr. 3, 2020

(87) PCT Pub. No.: WO2019/081243
PCT Pub. Date: May 2, 2019

(65) Prior Publication Data
US 2020/0334573 A1  Oct. 22, 2020

(30) Foreign Application Priority Data

Oct. 26, 2017  (DE) .......................... 102017219274.7

(51) Int. Cl.
| | |
|---|---|
| *G06N 20/00* | (2019.01) |
| *G06K 9/62* | (2022.01) |
| *G06F 30/27* | (2020.01) |
| *G06N 3/084* | (2023.01) |

(52) U.S. Cl.
CPC ............ *G06N 20/00* (2019.01); *G06F 30/27* (2020.01); *G06K 9/623* (2013.01); *G06N 3/084* (2013.01)

(58) Field of Classification Search
CPC ...... G06N 20/00; G06N 3/084; G06N 3/0454; G06F 30/27; G06K 9/623
See application file for complete search history.

(56) References Cited

U.S. PATENT DOCUMENTS

2019/0122077 A1*  4/2019  Tsishkou .............. G05D 1/0231

FOREIGN PATENT DOCUMENTS

DE  202017102381 U1  5/2017

OTHER PUBLICATIONS

"Explaining and Harnessing Adversarial Examples", Iam J. Goodfellow, Jonathon Shiens & Christian Szegedy, Mar. 20, 2015.*
International Search Report for PCT/EP2018/078005, dated Jan. 25, 2019.

(Continued)

*Primary Examiner* — Nha T Nguyen
(74) *Attorney, Agent, or Firm* — Norton Rose Fulbright US LLP; Gerard Messina

(57) ABSTRACT

A method for operating a detector that is set up to check whether a data signal that is supplied to a machine learning system has been manipulated. The machine learning system is first trained in adversarial fashion using a manipulated data signal, the manipulated data signal having been ascertained by manipulation of a training data signal, and the machine learning system being trained to provide in each case the same output signal when the training data signal or the manipulated data signal is supplied to it. The detector is trained using another manipulated data signal that is produced as a function of the trained machine learning system.

8 Claims, 2 Drawing Sheets

(56) References Cited

OTHER PUBLICATIONS

Jan Hendrik Metzen et al., "On Detecting Adversarial Perturbations", arxiv.org, 2017, pp. 1-12. XP055539598 https://arxiv.org/abs/1702.04267.
Sandy Huang et al., "Adversarial Attacks On Neural Network Policies", arxiv.org, 2017, pp. 1-10. XP055539606 https://arxiv.org/abs/1702.02284.
Liang, Bin et al., "Detecting Adversarial Examples in Deep Networks With Adaptive Noise Reduction", In: Computing Research Repository (CORR), 2017, pp. 1-13. http://abs/1705.08378V3.
Carlini, Nicholas et al., "Adversarial Examples Are Not Easily Detected: Bypassing Ten Detection Methods", In: Computing Research Repository (CORR), 2017, pp. 1-14. https://arxiv.org/abs/1705.07263V1.
Feinman, Reuben et al., "Detecting Adversarial Samples From Artifacts", In: Computing Research Repository (CORR), 2017, pp. 1-9. https://arxiv.org/abs/1703.0041ov2.

\* cited by examiner

METHOD AND APPARATUS FOR IMPROVING THE ROBUSTNESS OF A MACHINE LEARNING SYSTEM

FIELD

The present invention relates to a method for operating a detector, a computer program that includes instructions that are configured to carry out the method when it is executed on a computer, a machine-readable storage medium on which the computer program is stored, and a computer that is set up to carry out the method.

BACKGROUND INFORMATION

German Patent Application No. DE 20 2017 102 381 describes a device for generating a manipulated data signal for misleading a first machine learning system that is set up to ascertain a semantic segmentation of a received one-dimensional or multidimensional data signal, the device including a machine-readable storage medium on which commands are stored that, when executed by a computer, cause the computer to execute a method having the following steps:
a) ascertaining desired semantic segmentation of the manipulated data signal; and
b) generating the manipulated data signal as a function of the received data signal (and of the ascertained desired semantic segmentation, as well as an estimated semantic segmentation of the manipulated data signal).

SUMMARY

In accordance with the present invention, an example may have the advantage that it enables an output signal of a machine learning system to be made particularly robust against adversarial examples. Adversarial examples are slightly manipulated input data (that, in the case of image data, are so similar to the unmanipulated input data that they are practically indistinguishable by human experts) that can result in a significant change. For example, it is possible that a malicious attacker could use such an adversarial example to lead an autonomous robot into error, for example by suppressing a semantic segmentation that marks an actually existing river as "river," which could result in danger to the autonomous robot that is carrying out its route planning based on this semantic segmentation. With the method according to the present invention, the effectiveness of such attacks can be reduced.

Advantageous developments of the present invention are described herein.

In a first aspect, the present invention provides an example method for operating a detector that is set up to check whether a data signal that is supplied to a machine learning system is a manipulated data signal, i.e., has been manipulated, and thus may possibly result in an errored output signal of the machine learning system, the machine learning system having first been adversarially trained using a manipulated data signal.

Here, the manipulated data signal is ascertained by manipulation of a training data signal, and during the adversarial training the machine learning system is trained to provide the same output signal in each case regardless of whether the system has been provided with the training data signal or the manipulated data signal.

The detector is then trained using another manipulated data signal that is produced as a function of the trained machine learning system.

That is, the detector is trained to decide that the data signal supplied to it is a manipulated data signal, i.e., has been manipulated, when another manipulated data signal has been supplied to the detector, and to decide that this is not the case if the data signal supplied to the detector is not another manipulated data signal.

This has the advantage that the detector is particularly robust, because the space of possible additional manipulated data signals is smaller than the space of the manipulated data signals. A detector trained in this way is therefore in particular particularly well suited for use in order to detect that the input signals are adversarial examples.

The occurrence of such adversarial examples is a property of numerous machine learning systems, if the space of their input quantities is high-dimensional. The machine learning system can correspondingly be a deep neural network, or a (multiclass) logistic regression, a k-nearest neighbors algorithm, or a support vector machine.

In particular, it can be provided that the manipulated data signal is selected as a function of a gradient of a cost function, which is a function of the input signal, of the machine learning system, the gradient pointing in the direction of a desired output signal. In this way, manipulated data signals can be generated particularly easily that, despite their very great similarity to the unmanipulated data signal, result in a different output signal of the machine learning system, in particular a different classification result.

Preferably, the manipulated data signal is produced in such a way that its difference from the data signal contains a term that points in the direction opposite to that of this gradient.

Alternatively or in addition, it can be provided in accordance with the present invention that the additional manipulated data signal is selected as a function of a second gradient of a cost function, which is a function of the input signal, of the adversarially trained machine learning system, the second gradient pointing in the direction of a desired output signal. In this way, additional manipulated data signals can be generated particularly easily that, despite their very great similarity to the unmanipulated data signal, result in a different output signal of the machine learning system, in particular a different classification result.

Preferably, the additional manipulated data signal is produced in such a way that its difference from the data signal contains a term that points in the direction opposite that of this second gradient.

In a further aspect of the present invention, it can be provided that the detector checks whether a data signal that is supplied to the machine learning system will result in an errored output signal of the machine learning system.

This can be used in particular to realize a controlling of an agent, in particular of an actuator, such as of an at least partly autonomous robot, as a function of the ascertained output signal and of a test result of the detector. In this way, the controlling is made particularly robust against attacks with adversarial examples.

In further aspects, the present invention provides an example computer program that is set up to carry out the method according to the present invention. That is, the computer program includes instructions that cause a computer to carry out the method according to the present invention when it executes the computer program.

In still other aspects, the present invention provides an example machine-readable storage medium on which this computer program is stored, and to a computer that is set up to carry out the method.

Below, specific embodiments of the present invention are explained in more detail with reference to the figures.

DETAILED DESCRIPTION OF EXAMPLE EMBODIMENTS

Figure 1:
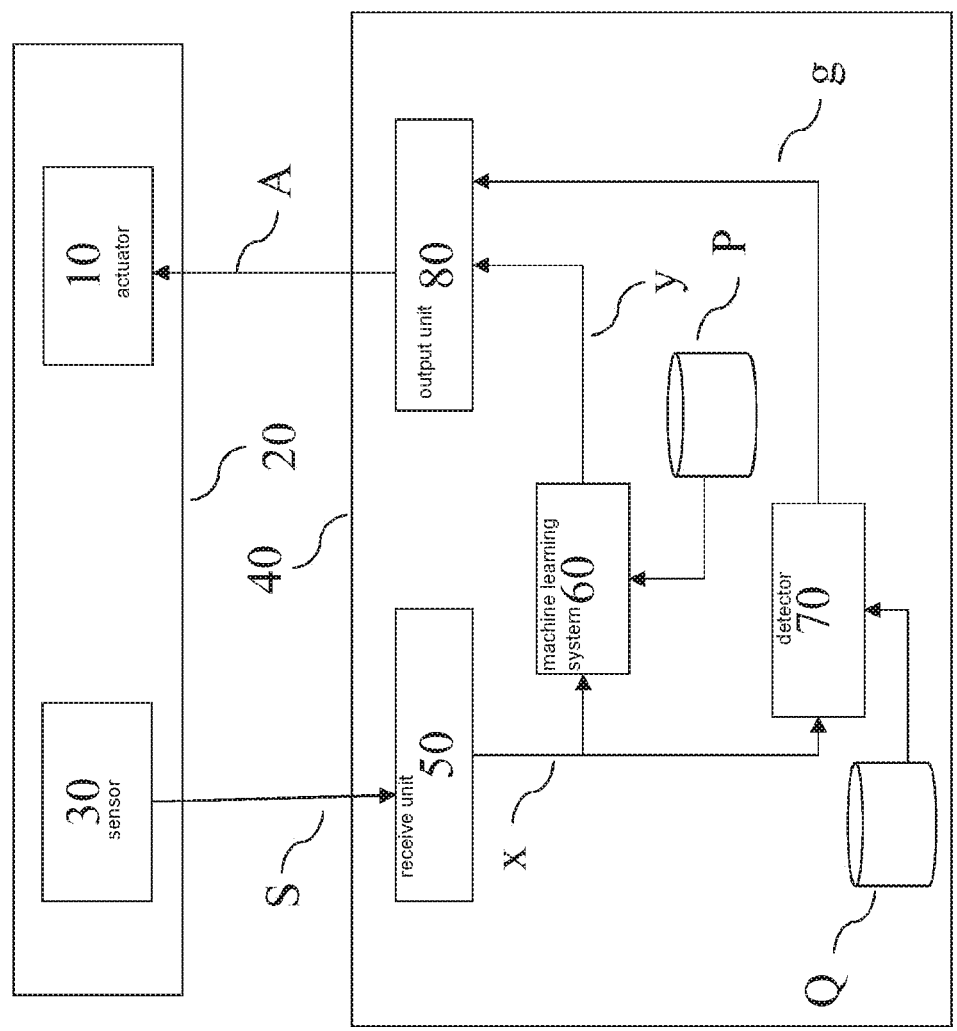
FIG. 1 schematically shows a possible use of a detector according to the present invention.

FIG. 1 shows, as an example, an actuator 10 in its environment 20, in interaction with an actuator control system 40. Actuator 10 and environment 20 are also referred to together in the following as the actuator system. A state of the actuator system is acquired by a sensor 30, which may also be a plurality of sensors. An output signal S of sensor 30 is communicated to actuator control system 40. From this, actuator control system 40 ascertains a control signal A that actuator 10 receives.

Actuator 10 can for example be a (partly) autonomous robot, for example a (partly) autonomous motor vehicle. Sensor 30 can for example be one or more video sensors and/or one or more radar sensors and/or one or more ultrasound sensors and/or one or more position sensors (for example, GPS). Alternatively or in addition, sensor 30 can also include an information system that ascertains an item of information about a state of the actuator system, such as a weather information system that ascertains a current or future state of the weather in environment 20.

In another exemplary embodiment, actuator 10 can be a manufacturing robot, and sensor 30 can then for example be an optical sensor that acquires properties of products manufactured by the manufacturing robot.

In a further exemplary embodiment, actuator 10 can be an enable system that is set up to enable, or to not enable, the activity of a device. Sensor 30 can be for example an optical sensor (for example for acquiring image data or video data) that is set up to acquire a face. Actuator 10 ascertains, as a function of control signal A, an enable signal that can be used to enable the device as a function of the value of the enable signal. The device can for example be a physical or logical access control. As a function of the value of control signal A, the access control can then grant access or deny access.

It is also possible that, instead of actuator 10, for example a medical diagnosis system is controlled that outputs a medical diagnosis as a function of control signal A. If sensor 30 is an optical sensor that acquires medical images, then control signal A can for example be a semantic segmentation of the images, provided with remarks if applicable, in which regions that appear particularly relevant for a medical diagnosis are highlighted. In this case, reference character 40 designates an agent control system.

Actuator control system 40 receives output signal S of the sensor in an optional receive unit 50 that converts output signal S into a data signal x (alternatively, output signal S can also be adopted immediately as data signal x). Data signal x can for example be a segment or a further processing of output signal S. Data signal x is supplied to a machine learning system 60, for example a neural network. Machine learning system 60 is characterized by parameters that are stored in a parameter memory P.

In a preferred exemplary embodiment, described in the following, data signal x is a two-dimensional image signal whose pixels are characterized by, for example, one (brightness coding) or three numerical values (RGB coding). However, data signal x can also be some other one-dimensional or multidimensional data signal.

Machine learning system 60 ascertains from image signal x an associated output signal y, for example a pixel-by-pixel semantic segmentation. Here, a semantic value is assigned to each region of image signal x.

Actuator control system 40 further includes a detector 70, for example a neural network. Detector 70 also receives image signal x and ascertains therefrom a detector signal g, which can be for example a number in the value range [0; 1] and can characterize a probability that image signal x has been manipulated in such a way that semantic segmentation y does not correctly characterize image data x. The detector is characterized by parameters that are stored in a second parameter memory Q.

In the exemplary embodiment, this is achieved in that detector 70 is set up in such a way that detector signal g characterizes a probability that image signal x is an adversarial example.

Semantic segmentation y and detector signal g are communicated to an output unit 80 that ascertains control signal A therefrom. For example, it is possible for the output unit first to check whether detector signal g is smaller than a specifiable threshold value. If this is the case, then control signal A is ascertained as a function of semantic segmentation y. This is the normal case. If, in contrast, it is ascertained that detector signal g is not smaller than the specifiable threshold value, then it can be provided that control signal A is designed in such a way that it causes actuator A to go into a secured mode. This is the case when detector 70 detects an error in image signal x.

In an exemplary embodiment, actuator control system 40 includes a computer and a machine-readable storage medium (not shown) on which a computer program is stored that, when it is executed by the computer, causes the computer to carry out the described functionalities of actuator control system 40. Machine learning system 60 and detector 70 can here be implemented in particular as separate or common computer programs.

Figure 2:
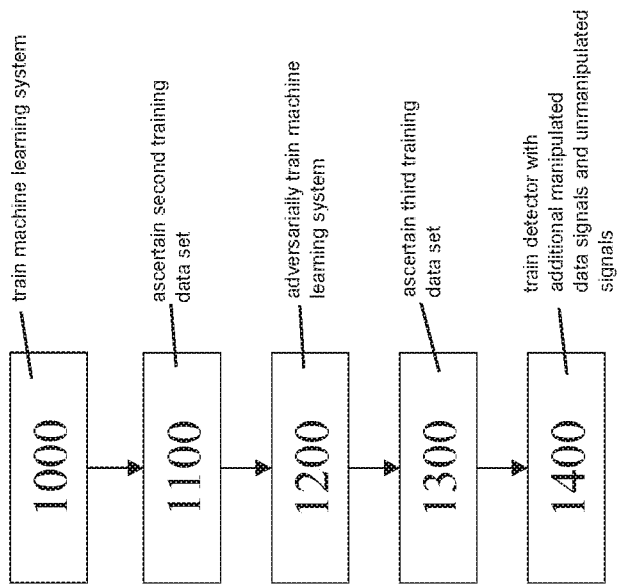
FIG. 2 shows, in a flow diagram, a possible sequence of a training method of the detector.

FIG. 2 shows, in a flow diagram, the possible sequence of an example training method of detector 70. First (1000), machine learning system 60 is trained in a standard manner to generate output signals y that match input signals x. This can take place for example in monitored fashion using a training data set that contains input signals x and desired output signals yt respectively assigned to the input signals. By evaluating a cost function (loss function) J between generated output signals y and desired output signals yt, the parameters of the machine learning system 60 can then be adapted by backpropagation.

Instead of step (1000), a pre-trained machine learning system 60 can also be used.

Then (1100) a second training data set is ascertained; for example, it is read out from a computer memory. The second training data set contains training signals $X^{train}$ having assigned desired output signals $y^{train}$. Respectively assigned adversarial examples $x^{adv}$ are generated for these training signals $x^{train}$. This is done for example through iterative application of the equations $$x_0^{adv}=0$$

$$x_{n+1}^{adv}=\text{Clip}_{x,e}(x_n^{adv}+\alpha \cdot \text{sgn}(\nabla_x J(x_n^{adv}, y^{train}))). \qquad (1)$$

Here, the parameter $\alpha$ can be chosen to be for example equal to 1. The function $\text{Clip}_{x,e}(e)$ limits an argument e here to an $\varepsilon$-neighborhood around e, for example in a maximum rule. If the iteration here is sufficiently convergent for an index m, the adversarial example x is selected equal to $x_m^{adv}$.

Alternatively, in step (1100) a set of training signals $X^{train}$, and assigned adversarial signals $X^{adv}$, can simply be read in.

Machine learning system 60 is then (1200) adversarially trained, i.e., training signals $X^{train}$ and assigned adversarial signals $x^{adv}$ are supplied to machine learning system 60, and the assigned output signals $y^{true}$ (for training signal $x^{train}$) and $y^{false}$ (for adversarial signal $x^{adv}$) are ascertained. The parameters that characterize machine learning system 60 are now adapted (e.g. via a suitable cost function and back-propagation) in such a way that the two output signals $y^{true}$ and $y^{false}$ are as close to equal as possible.

Steps (1100) and (1200) can also be carried out in multiply iterated fashion, e.g. in such a way that in step (1100) in each case a stack of adversarial signals $X^{adv}$ is generated, with which machine learning system 60 is then adversarially trained in step (1200). Step (1100) can then be carried out again on the basis of the thus trained machine learning system 60, etc.

Subsequently (1300), a third training data set is ascertained, for example by reading it from a computer memory. The third training data set also contains training signals $x^{train}$. Analogous to step (1100), additional manipulated data signals $x^{adv;2}$ are now generated. It is to be noted that here, in the application of equation (1), the cost function J is a function of the parameters that characterize machine learning system 60. Through this, the adversarial training of machine learning system 60 carried out in step (1200) affects the generation of the additional manipulated data signals $x^{adv;2}$. Assigned desired output signals $y^{train}$ are generated that for example assume the value 0 when the signal that is to be supplied to detector 70 in the next step (1400) is an unmanipulated training signal $x^{train}$, and assume the value 1 when the signal to be supplied to detector 70 is another manipulated data signal $x^{adv;2}$.

Detector 70 is then (1400) trained with the additional manipulated data signals $x^{adv;2}$ and additional unmanipulated signals $x^{train}$ so that its output signal g indicates, to the greatest possible extent, that a manipulated signal is present when one of the additional manipulated data signals $x^{adv;2}$ is supplied to detector 70, and to the greatest possible extent indicates that no manipulated signal is present when an unmanipulated signal $x^{train}$ is supplied to detector 70. With this, the learning method for the training of detector 70 terminates.

The example method can be implemented as a computer program, i.e., in software or in hardware, or in a mixed form of hardware and software.

What is claimed is:

1. A method for operating a detector that is set up to check whether a data signal that is supplied to a machine learning system has been manipulated, the method comprising the following steps:
adversarially training the machine learning system using a manipulated data signal, the manipulated data signal having been ascertained by manipulation of a training data signal, the machine learning system being trained to provide in each case the same output signal when the training data signal or the manipulated data signal is supplied to the machine learning system; and
training the detector, wherein the detector is separate from the machine learning system and is configured to output a signal indicating a probability that the data signal supplied to the machine learning system has been manipulated, the training the detector using an additional manipulated data signal that is produced as a function of the trained machine learning system.

2. The method as recited in claim 1, wherein the manipulated data signal is selected as a function of a gradient of a cost function, which is a function of the data signal that is supplied to the machine learning system, the gradient pointing in a direction of a target output signal.

3. The method as recited in claim 2, wherein the manipulated data signal is produced in such a way that its difference from the data signal contains a term that points in a direction opposite that of the gradient.

4. The method as recited in claim 1, the additional manipulated data signal is selected as a function of a second gradient of a cost function, which is a function of the data signal of the adversarially trained machine learning system, the second gradient pointing in a direction of a target output signal).

5. The method as recited in claim 4, wherein the additional manipulated data signal is produced in such a way that its difference from the data signal contains a term that points in a direction opposite that of the second gradient.

6. The method as recited in claim 1, further comprising:
controlling an agent as a function of the ascertained output signal and of a test result of the detector.

7. A non-transitory machine-readable storage medium on which is stored a computer program for operating a detector that is set up to check whether a data signal that is supplied to a machine learning system has been manipulated, the computer program, when executed by a computer, causing the computer to perform the following steps:
adversarially training the machine learning system using a manipulated data signal, the manipulated data signal having been ascertained by manipulation of a training data signal, the machine learning system being trained to provide in each case the same output signal when the training data signal or the manipulated data signal is supplied to it; and
training the detector, wherein the detector is separate from the machine learning system and is configured to output a signal indicating a probability that the data signal supplied to the machine learning system has been manipulated, the training the detector using an additional manipulated data signal that is produced as a function of the trained machine learning system.

8. A computer configured to operate a detector that is set up to check whether a data signal that is supplied to a machine learning system has been manipulated, the computer configured to:
adversarially train the machine learning system using a manipulated data signal, the manipulated data signal having been ascertained by manipulation of a training data signal, the machine learning system being trained to provide in each case the same output signal when the training data signal or the manipulated data signal is supplied to the machine learning system; and train the detector, wherein the detector is separate from the machine learning system and is configured to output a signal indicating a probability that the data signal supplied to the machine learning system has been manipulated, the training the detector using an additional manipulated data signal that is produced as a function of the trained machine learning system.

* * * * *